United States Patent [19]

Yamaguchi et al.

[11] Patent Number: 5,466,303
[45] Date of Patent: Nov. 14, 1995

[54] SEMICONDUCTOR DEVICE AND MANUFACTURING METHOD THEREFOR

[75] Inventors: Hitoshi Yamaguchi, Nagoya; Seiji Fujino, Toyota; Tadashi Hattori, Okazaki, all of Japan

[73] Assignee: Nippondenso Co., Ltd., Kariya, Japan

[21] Appl. No.: 410,366

[22] Filed: Mar. 24, 1995

[30] Foreign Application Priority Data

Mar. 25, 1994 [JP] Japan ...................... 6-055780

[51] Int. Cl.$^6$ ................................. H01L 21/20
[52] U.S. Cl. ............................. 148/33; 437/27; 437/28; 148/33.1; 148/DIG. 12
[58] Field of Search .................. 148/33, DIG. 12, 148/33.1; 437/27, 28

[56] References Cited

U.S. PATENT DOCUMENTS

| | | | |
|---|---|---|---|
| 4,638,552 | 1/1987 | Shimbo et al. | 148/DIG. 12 |
| 4,935,386 | 6/1990 | Nakagawa et al. | 148/DIG. 12 |
| 4,939,101 | 7/1990 | Black et al. | 437/62 |
| 5,128,277 | 7/1992 | Hideshima et al. | 148/DIG. 12 |
| 5,141,887 | 8/1992 | Liaw et al. | 437/62 |
| 5,374,582 | 12/1994 | Okonogi et al. | 148/DIG. 12 |

FOREIGN PATENT DOCUMENTS

| | | |
|---|---|---|
| 50-40083 | 4/1975 | Japan . |
| 61-183917 | 8/1986 | Japan . |
| 61-224457 | 10/1986 | Japan . |
| 62-128532 | 6/1987 | Japan . |
| 1259570 | 10/1989 | Japan . |
| 5198549 | 8/1993 | Japan . |

OTHER PUBLICATIONS

Yamaguchi, et al: "Fabrication of Super Junction by Wafer Direct Bonding", Extended Abstracts (The 41st Spring Meeting, 1994) No. 2, The Japan Society of Applied Physics and Realted Societies, Mar. 28, 1994, 29p-ZL-15.

Primary Examiner—Tom Thomas
Assistant Examiner—Trung Dang
Attorney, Agent, or Firm—Cushman, Drby & Cushman

[57] ABSTRACT

A semiconductor device, which can easily form hyper abrupt junction type junction having a desired depletion layer width or transition region width, is disclosed. A silicon oxide film is formed on the mirror polished side surface of a P-type semiconductor substrate. Then, a P-type diffusion layer is formed by means of heat treatment. In this process, impurity concentration distribution is formed in such a way that the impurity concentration distribution can abruptly decrease from the mirror polished side surface of the substrate. Following this, the oxide film is removed by etching, and hyper abrupt type PN junction is obtained by sticking the mirror polished side surface of a high impurity concentration N-type semiconductor substrate and the high impurity concentration diffusion side of the above P-type semiconductor substrate to each other in the same surface direction as that of the above P-type semiconductor substrate. Then, the P-type semiconductor substrate is ground and polished from the non-mirror polished surface side for thinning. Finally, a silicon oxide film is formed on the ground and polished surface side, ions are implanted thereinto and heat treatment is provided thereto within the nitrogen atmosphere to form a P$^+$-type diffusion layer.

13 Claims, 5 Drawing Sheets

(: BONDED INTERFACE / PN JUNCTION)

SEMICONDUCTOR DEVICE AND MANUFACTURING METHOD THEREFOR

CROSS REFERENCE TO RELATED APPLICATION

This application is based upon and claims the benefit of priority of the prior Japanese Patent application No. 6-55780 filed on Mar. 25, 1994, the contents of which are incorporated herein by reference.

BACKGROUND OF THE INVENTION

1. Field of the Invention

The present invention is generally relates to a semiconductor device and a manufacturing method therefor. More particularly, the present invention relates to a semiconductor device having PN junction and a manufacturing method therefor. The present invention is applied to, for example, a variable capacitance element for use in voltage controlling the frequency of a communication VCO oscillator or filter, to an Esaki diode for use in an switching element in a microwave oscillator, microwave amplifying circuit or logic circuit, or to a light emitting diode (LED) or semiconductor laser diode for use in a commercial, vehicle equipped or industrial display.

2. Related Arts

Conventionally, a varicap diode which controls the capacity of a depletion layer caused to PN junction by controlling applied voltage has widely been used for a VCO (voltage controlled oscillator) unit for a communication instrument or the like. The capacity of the depletion layer of a variable capacitance element is used as the capacity of a parallel-plate capacitor which uses the ends of depletion layers spread in a P-type layer and an N-type layer respectively formed in course of junction as a distance thereof and also uses the cross sections of a P-type layer and an N-type layer positioned at the ends of the depletion layers respectively as a plate area thereof. This capacity of the depletion layer is in proportion to the cross section of the parallel plates (i.e., the plate area) and in inverse proportion to the distance. The characteristics of the above VCO unit depend on what type of varicap diode is selected. For example, as required abilities, the VCO unit must be able to reduce and stabilize distortion in the modulation or demodulation of communication signals, greatly change the oscillation frequency with a small input voltage change, and save power consumption by means of low voltage driving. In contrast with these requirements, the varicap diode must be able to have a high linearity of C-V (the relationship between capacity of the depletion layer and applied voltage) curve, have a wide capacity variation width, and obtain sufficient capacity variation even with a low voltage. Generally, the spread of a depletion layer is controlled by the applied voltage, and the spread of the depletion layer is in proportion to $V^{1/3}$ of the applied voltage in graded junction type and in proportion to $V^n$ (n=2 to 3) of the applied voltage in hyper abrupt junction type. Accordingly, in the varicap diode, PN junction of hyper abrupt junction type in which the spread of the depletion layer varies more greatly against the same applied voltage compared with the graded junction type is preferable.

Conventionally, as a manufacturing method for the above varicap diode, epitaxial planar type has been used. In the epitaxial planar type, a high impurity concentration semiconductor substrate on which a low impurity concentration epitaxial layer of the same conductivity type is grown is prepared, and a deep impurity diffusion layer of the same conductivity type as that of the epitaxial layer is formed from the surface of the epitaxial layer, and furthermore, a shallow impurity diffusion layer of different conductivity type from that of the epitaxial layer is formed to obtain PN junction.

On the other hand, a light emitting diode and a semiconductor laser diode are requested to dispose a P-type degenerate semiconductor and an N-type degenerate semiconductor, both of which have a high impurity concentration, close to each other, to thereby raise recombination efficiency in the transition region.

In the Esaki diode used for microwave communication, as ON/OFF current ratio and switching speed in switching must be raised, the above two degenerate regions are disposed as close as possible to each other to form PN junction.

However, in the conventional varicap diode, as two different conductive impurities are diffused from the substrate surface by means of ion implantation and annealing one by one in the epitaxial planar type, the impurity diffused earlier further diffuses under the effect of the heat received during the impurity diffusion process of the other impurity. As a result, the impurity distribution called "step type" is formed as illustrated in FIG. 9. Therefore, the epitaxial planar type has a problem that the hyper abrupt type junction having a desired depletion layer width or transition region width is hard to obtain.

In the Esaki diode, as diffusion is achieved by alloying indium with Ge and the degenerate regions are positioned as close as possible to each other to form PN junction, there is a problem that the hyper abrupt type junction having a desired depletion layer width or transition region width is hard to obtain.

Furthermore, in the light emitting diode and a semiconductor laser diode, it is requested to position the P-type degenerate semiconductor and N-type degenerate semiconductor both of which have a high impurity concentration close to each other. In the epitaxial planar type, however, there is a problem that the hyper abrupt type junction having a desired depletion layer width or transition region width is hard to obtain.

SUMMARY OF THE INVENTION

The present invention, therefore, is to solve the above problem, and a primary object of the present invention is to obtain a semiconductor device which can easily form the hyper abrupt type PN junction having a desired depletion layer width or transition region width.

The semiconductor device according to the present invention composed in order to achieve the above object comprises a first semiconductor substrate of a first conductivity type, an impurity layer of the first conductivity type formed on a main surface of the first semiconductor substrate and having impurity distribution in which impurity concentration abruptly lowers in a depth direction from the main surface side of the first semiconductor substrate, and a second semiconductor substrate of a second conductivity type formed with the main surface of the first semiconductor substrate on the impurity layer side and a main surface of the second semiconductor substrate bonded to each other and having hyper abrupt type PN junction between the impurity layer and the second semiconductor substrate.

Incidentally, the impurity layer may preferably have impurity distribution in which the concentration distribution of the impurity is in proportion to a (−3/2) power of a depth from the main surface side of the first semiconductor substrate in the depth direction from the main surface side of the first semiconductor substrate.

Furthermore, in the above composition, it is preferable that the semiconductor device may have a second impurity layer of a second conductivity type formed on the main surface of the second semiconductor substrate and having impurity distribution in which impurity concentration abruptly lowers in a depth direction from the main surface side of the second semiconductor substrate. It is also preferable that the second impurity layer may have impurity distribution in which the concentration distribution of the impurity is in proportion to a (−3/2) power of a depth from the main surface side of the second semiconductor substrate in the depth direction from the main surface side of the second semiconductor substrate.

Furthermore, the manufacturing method for the semiconductor device according to the present invention comprises the steps of forming an insulating film on a first conductive substrate of a first conductivity type, implanting impurities of the first conductivity type through the insulating film into the first semiconductor substrate so that impurity distribution can abruptly decreases in a depth direction from a main surface side, removing the insulating film, bonding the main surface of the first semiconductor substrate and a main surface of a second semiconductor substrate to each other, and forming a PN junction between the first semiconductor substrate and the second semiconductor substrate by providing heat treatment to the bonded first semiconductor substrate and second semiconductor substrate.

According to the present invention, as the first semiconductor substrate and the second semiconductor substrate are directly bonded to each other, the impurity distribution of the first conductivity type formed on the first semiconductor substrate beforehand changes little. Therefore, a semiconductor device having hyper abrupt type PN junction in which the impurity distribution abruptly lowers from the bonded interface between the first semiconductor substrate and the second semiconductor substrate to the first semiconductor substrate side can be obtained. Accordingly, a semiconductor device, which can easily form hyper abrupt type PN junction having a desired depletion layer width or transition region width, can be obtained.

Furthermore, the above is the case with the second semiconductor substrate, and the impurity distribution of the second conductive type formed on the second semiconductor substrate beforehand changes little. Therefore, a semiconductor device having hyper abrupt type PN junction in which the impurity distribution abruptly decreases from the bonded interface between the first semiconductor substrate and the second semiconductor substrate to the both substrate sides can be obtained. Accordingly, a semiconductor device, which can easily form hyper abrupt type PN junction having a desired depletion layer width or transition region width, can be obtained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A semiconductor device according to the first embodiment of the present invention will now be described referring to the appended drawings. This embodiment is an application of the present invention to a variable capacitance element (varicap diode).

A manufacturing procedure for the variable capacitance element according to this embodiment will be described referring to FIGS. 1A through 1D.

Figure 1A:
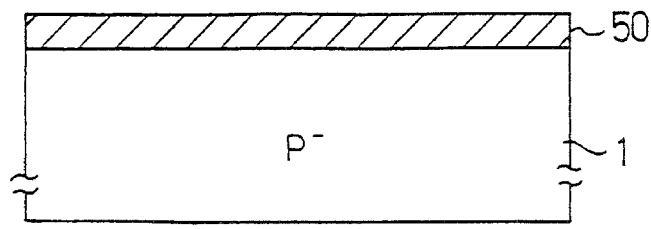
FIGS. 1A to 1D are cross-sectional views illustrating in series the manufacturing procedure when the semiconductor device according to the present invention is applied to a varicap diode.

As illustrated in FIG. 1A, a silicon oxide film (insulating film) 50 is formed on the mirror polished side surface (main surface) of a P-type semiconductor substrate (first semiconductor substrate) 1 having an impurity concentration of $1\times10^{17}$ cm$^{-3}$ or less by means of thermal oxidation.

Figure 1B:
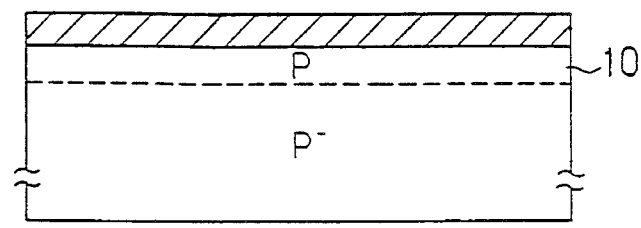

Then, as illustrated in FIG. 1B, a P-type diffusion layer (semiconductor layer) 10 is formed by means of boron ion implantation and heat treatment within the nitrogen atmosphere. In this process, in order to form an impurity concentration distribution in such a way that the impurity concentration distribution abruptly decreases from the mirror polished side surface of the substrate 1, the P-type diffusion layer 10 is formed as follows: boron ions are implanted with a high energy into the substrate 1; heat treatment is provided thereto at a high temperature to form a deep diffusion layer with a low impurity concentration (P$^-$-type layer); boron ions are implanted with a low energy into the substrate 1; and then heat treatment is provided thereto at a low temperature to form a shallow layer with a high impurity concentration layer (P-type layer), whereby a desired impurity concentration distribution is obtained by adjusting the combination of the both P-type layers. In this P-type layer, it should be confirmed that the impurity concentration in the surface of the P-type diffusion layer 10 is $1\times10^{19}$ cm$^{-3}$ or more and that the impurity concentration distribution from the surface side thereof is such that the impurity concentration lowers at a rate of 1 order (e.g., from $10^{18}$ cm$^{-3}$ to $10^{17}$ cm$^{-3}$) per approximately 50 nm downward. After these steps, the oxide film 50 is removed by means of etching.

Figure 1C:
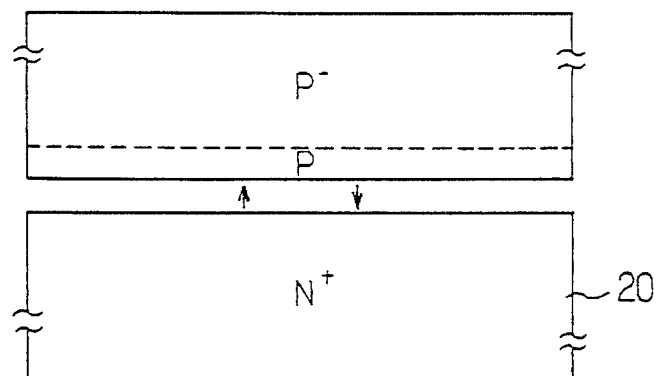

Next, as illustrated in FIG. 1C, a high impurity concentration N-type semiconductor substrate (second semiconductor substrate) 20 having the same face direction of crystal plane as that of the P-type semiconductor substrate 1 and an impurity concentration of $1\times10^{18}$ cm$^{-3}$ or more is prepared. As an N-type impurities for this substrate 20, arsenic having a small diffusion constant is preferable. Then, the mirror polished side surface (main surface) of this N-type semiconductor substrate 20 and the high boron concentration diffusion side of the P-type semiconductor substrate 1 are joined and bonded to each other by means of wafer direct bonding method. For this bonding, it is desirable that a low temperature of 900° C. or less should be used for heat treatment considering the maintenance of the hyper abrupt type impurity distribution and substrate junction.

Figure 2:
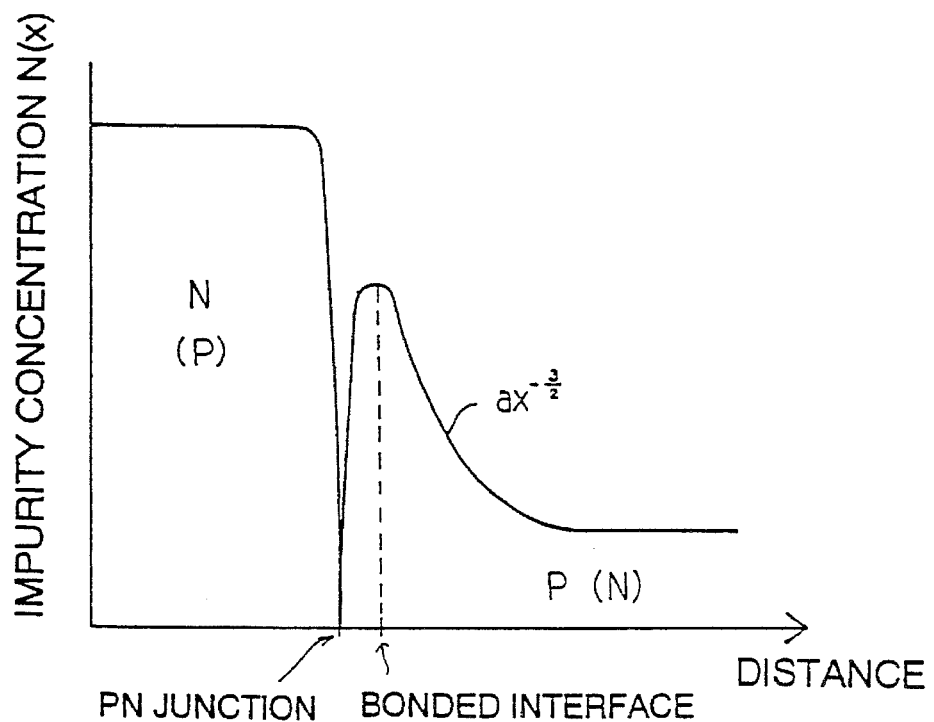
FIG. 2 is a graph showing an impurity concentration profile of the hyper abrupt type PN junction.

For information, in order to prevent the influence of the discontinuity of the bonded interface on the diode characteristics by the bonding process, it is advisable to form a shallow P-type diffusion layer of 0 to 0.1 μm (third impurity layer) on the N-type semiconductor substrate surface beforehand and thereby shift the PN junction from the bonded interface (see FIG. 2).

In the same way, it is also possible that P-type impurities are diffused into the N-type substrate by means of heat treatment during the bonding process, and thereby the bonded interface line and the PN junction are shifted from each other, like FIG. 2, to form a PN diode.

Figure 1D:
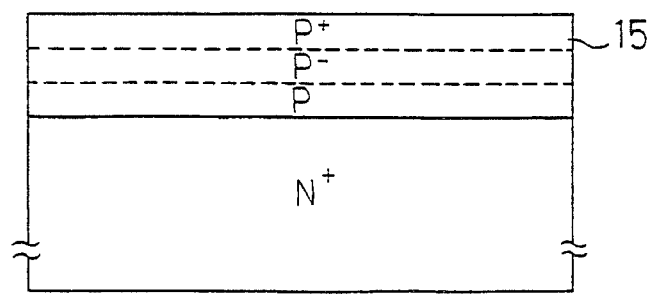

Then, the P-type semiconductor substrate 1 is ground and polished from the non-mirror polished side surface thereof to thin down the thickness thereof to 0.1 μm to 10 μm to make the surface mirror polished. Furthermore, as illustrated in FIG. 1D, a silicon oxide film is formed on the ground and polished surface side of the P-type semiconductor substrate 1, boron ions are implanted thereinto and heat treatment is provided thereto within the nitrogen atmosphere to form a P$^+$-type diffusion layer 15.

As the present invention uses bonding method for forming PN junction part as described above, hyper abrupt type PN junction having a desired depletion layer width or transition region width can easily be formed.

Figure 3:
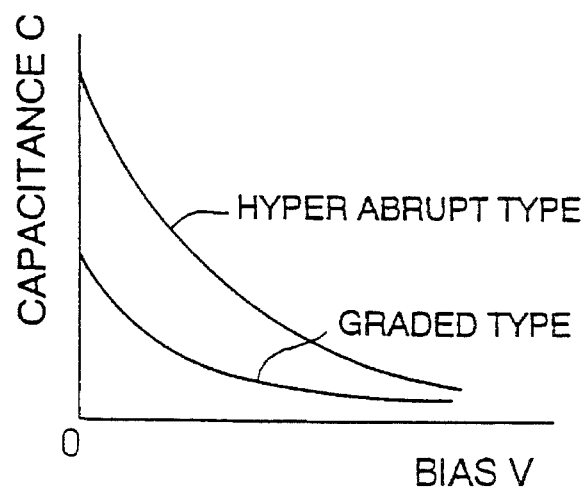
FIG. 3 is a graph showing the voltage-capacity characteristics of the hyper abrupt junction type PN junction and epitaxial planar type PN junction.

Also, in this embodiment, as illustrated in FIG. 3, C-V characteristics in proportion to $C \propto V^{-1/n}$ (n=2 to 3) can be obtained, and capacity can be varied larger against the change in voltage compared with the conventional epitaxial planar type junction. Particularly in a low voltage region, this advantage is so conspicuous that capacity can be varied with a small voltage variation, whereby the power consumption of the VCO can be reduced.

In forming the hyper abrupt type, if it is so arranged that the impurity concentration lowers at a rate of $x^{-3/2}$ in the direction of depth x from the mirror polished side surface of the substrate, the junction capacity C and the applied voltage V has a relation of $C \propto V^{-2}$.

The above will now be reasoned by using the following equation.

Figure 4:
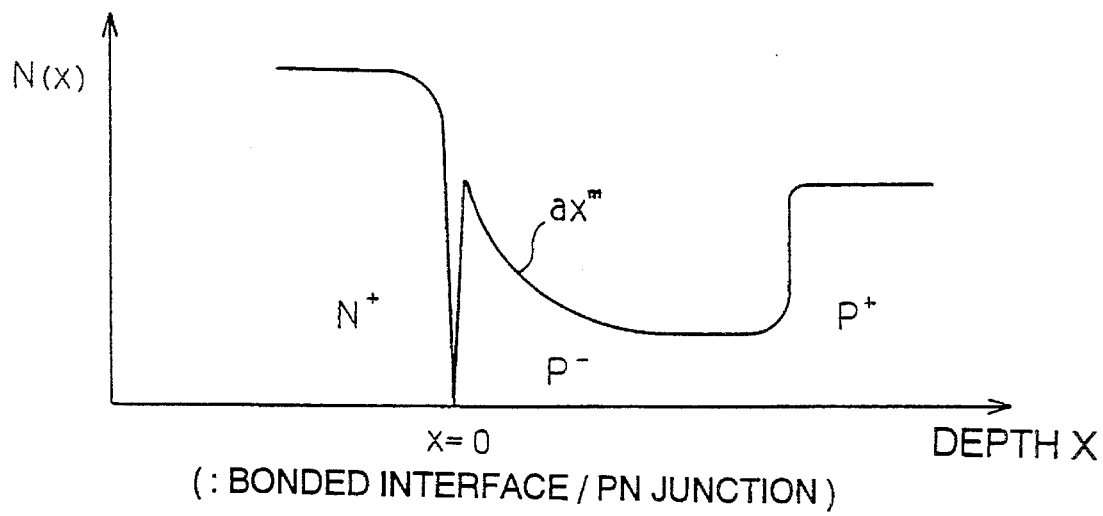
FIG. 4 is a graph showing an impurity concentration profile of the hyper abrupt type PN junction.

As illustrated in FIG. 4, when the hyper abrupt type impurity distribution is expressed by an $ax^m$ curve (a: constant, bonding position: x=0), Poisson's equation can be expressed as follows:

$$d^2V/dx^2 = q \cdot ax^m/(\epsilon \cdot \epsilon_0) \tag{1}$$

This equation is solved to obtain the applied voltage V. Then, the depletion layer end diffused on the P-type layer side is obtained by using the specified boundary conditions, electric charge Q generating in the neighborhood of the junction from the depletion layer end is obtained, and then the electric charge Q is differentiated by using the applied voltage V to obtain the junction capacity C. The obtained C can be expressed by the following equation:

$$C = dQ/dV = K(V+V_D)^{-1/(m+2)} \tag{2}$$

In this equation, K is constant (including a) and $V_D$ is a diffusion potential generated when the PN junction is formed. Therefore, in order to obtain $C \propto V^{-2}$ from this equation, the power of Equation (2) should be made −2. Here, the following equation can be established:

$$-1/(m+2) = -2 \tag{3}$$

From this equation, $m = -3/2$ can be obtained, and if m of the $ax^m$ curve indicating the hyper abrupt type impurity distribution is made $-3/2$ and therefore $ax^{-3/2}$, $C \propto V^{-2}$ can be obtained.

Next, the effect when the junction capacity C and the applied voltage V have a relation of $C \propto V^{-2}$ will be described.

The oscillation frequency f of the VCO can be expressed as $f = 1/2\pi(LC)^{1/2}$ and $f \propto C^{-1/2}$. When $C \propto V^{-2}$, the relation between the oscillation frequency and the applied voltage V is $f \propto V$, whereby the oscillation frequency f can be linearly controlled by using voltage, and circuit and other components can be made simple.

Incidentally, in obtaining the hyper abrupt type impurity concentration distribution, even if ion implantation is made for two or more times with different thermal oxide film thicknesses, the diffusion layer can be made. In this case, a thin thermal oxide film is formed on the substrate surface and boron ions are implanted thereinto to form a deep low impurity concentration diffusion layer, then a thick thermal oxide film is formed on the substrate surface and boron ions are implanted thereinto to form a shallow high impurity concentration diffusion layer. In this way, by forming the diffusion layer while changing the thermal oxide film thickness, a desired impurity concentration distribution can be obtained. If ion implantation energy is also changed at this time, the impurity concentration distribution of hyper abrupt junction type can be obtained more easily.

Furthermore, in the above first embodiment, though a low impurity concentration semiconductor substrate is used as a semiconductor substrate in which the impurity concentration distribution of hyper abrupt type from the bonded interface is formed, a high impurity concentration semiconductor substrate may be used instead. If the high impurity concentration semiconductor substrate is used, an N-type epitaxial layer of a low impurity concentration (<$1\times10^{17}$ cm$^{-3}$) of 0.1 μm to 10 μm in thickness is formed on the high impurity concentration N-type semiconductor substrate, a silicon oxide film is formed by means of thermal oxidation, and then phosphorus or arsenic ions are implanted thereinto and heat treatment is provided thereto within the nitrogen atmosphere as described in the above embodiment to form an N-type abrupt impurity concentration distribution. Then, by bonding the N-type semiconductor substrate and the P-type semiconductor substrate to each other, a hyper abrupt type PN junction can be obtained.

Also, according to this embodiment, as the hyper abrupt impurity distribution can be obtained from the bonded interface between the first semiconductor substrate and the second semiconductor substrate, a variable capacitance element with a high capacity variation ratio can be obtained. Furthermore, when a high impurity concentration semiconductor substrate is used as described above, the resistivity can be lowered, the ability against high frequency can be improved, and moreover, there is no need to grind and polish the semiconductor substrate for thinning in course of the manufacturing thereof.

(Second Embodiment)

A semiconductor device according to the second embodiment of the present invention will now be described referring to the drawings.

In the same way as the formation of the P-type diffusion layer 10 on the P-type semiconductor substrate according to the first embodiment, an N-type diffusion layer (second impurity layer) having an abrupt impurity distribution is formed on an N-type semiconductor substrate, and by bonding these two substrates to each other (FIGS. 5 and 6), a variable capacitance element with a higher capacity variation ratio compared with the hyper abrupt type PN junction with only one side can be obtained. This is because the depletion layer capacity of the variable capacitance element varies according to the spread of the depletion layer width due to the variation of the applied voltage, and the impurity distribution in which both the P-type layer and the N-type layer are of hyper abrupt types has a larger variation in the spread of the depletion layer against the applied voltage compared with the impurity distribution in which either of the P-type layer or the N-type layer is of hyper abrupt type. In this case, phosphorus with a large diffusion constant is used for the deep diffusion, while arsenic with a small diffusion constant is used for the shallow diffusion with abrupt lowering. In this arrangement, as the diffusion constant of the phosphorus is large, the time required for processing the formation of the hyper abrupt type impurity concentration distribution can be shortened, and as the arsenic has a small diffusion constant, there is no possibility that the impurity distribution after the bonding is displaced far from the desired hyper abrupt junction type impurity concentration distribution before the bonding. This is also the case with the formation of an impurity distribution which forms a hyper abrupt type junction in a high impurity concentration semiconductor substrate. As illustrated in FIG. 7, an impurity concentration distribution, which lowers at a rate of $x^{-1/2}$ in the direction of depth x from the bonded interface or the PN junction surface, may be formed in both the P-type semiconductor substrate and the N-type semiconductor substrate.

In the above embodiment, by arranging that the width of a region in which surface impurity concentration diffusing from the surface is set to 10Å or more on either the P-type side or the N-type side, a degenerate semiconductor PN junction of a 100A or less in the distance of the degenerate region can be formed.

Accordingly, as the PN junction is made by bonding in this embodiment as well, a hyper abrupt junction type PN junction having a desired depletion layer width or transition region width can easily be formed.

(Third Embodiment)

Figure 5:
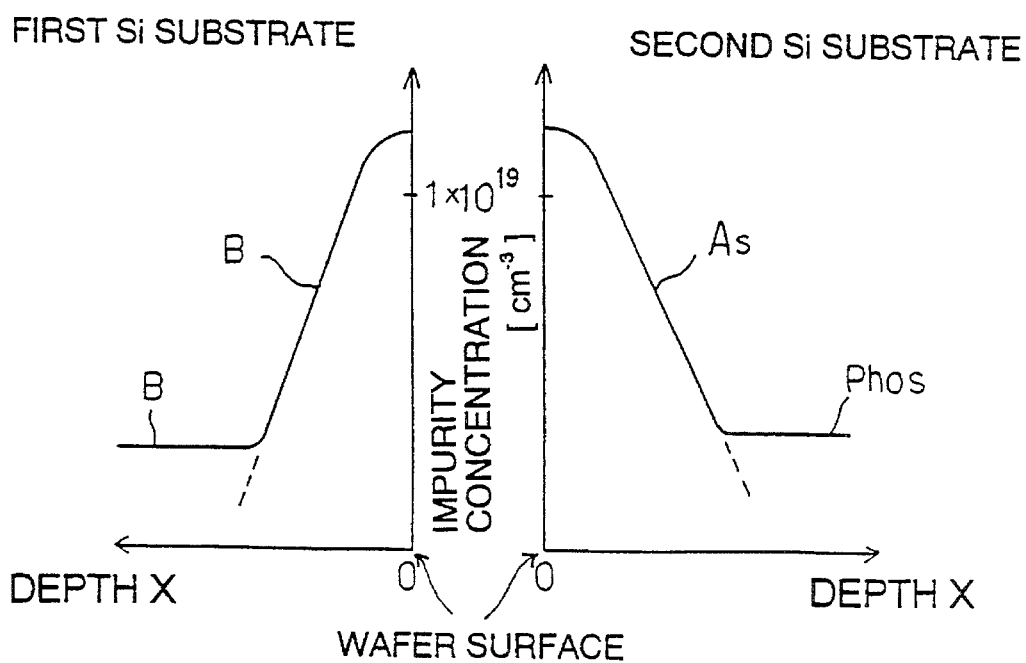
FIG. 5 is a graph showing an impurity concentration profile of a semiconductor device according to a second embodiment of the present invention.
Figure 6:
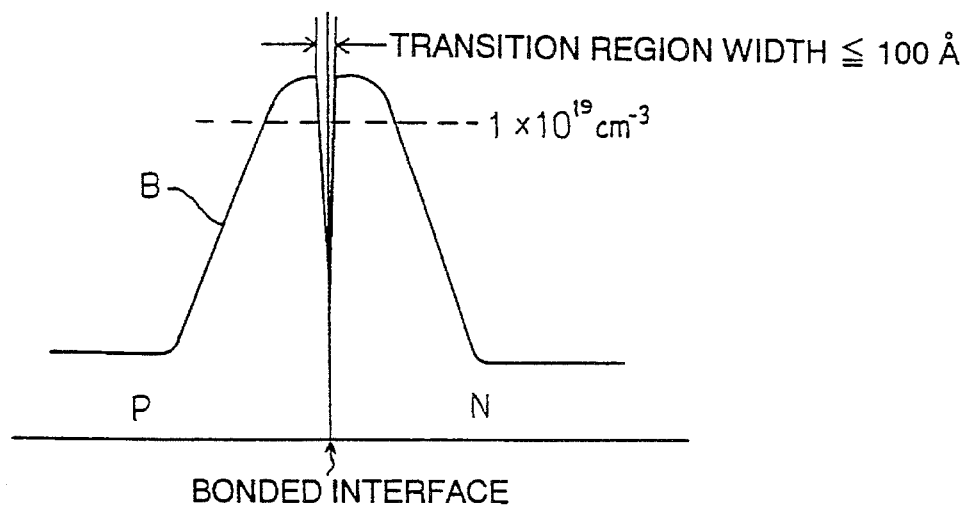
FIG. 6 is a graph showing an impurity concentration profile of the semiconductor device according to the second embodiment of the present invention.
Figure 7:
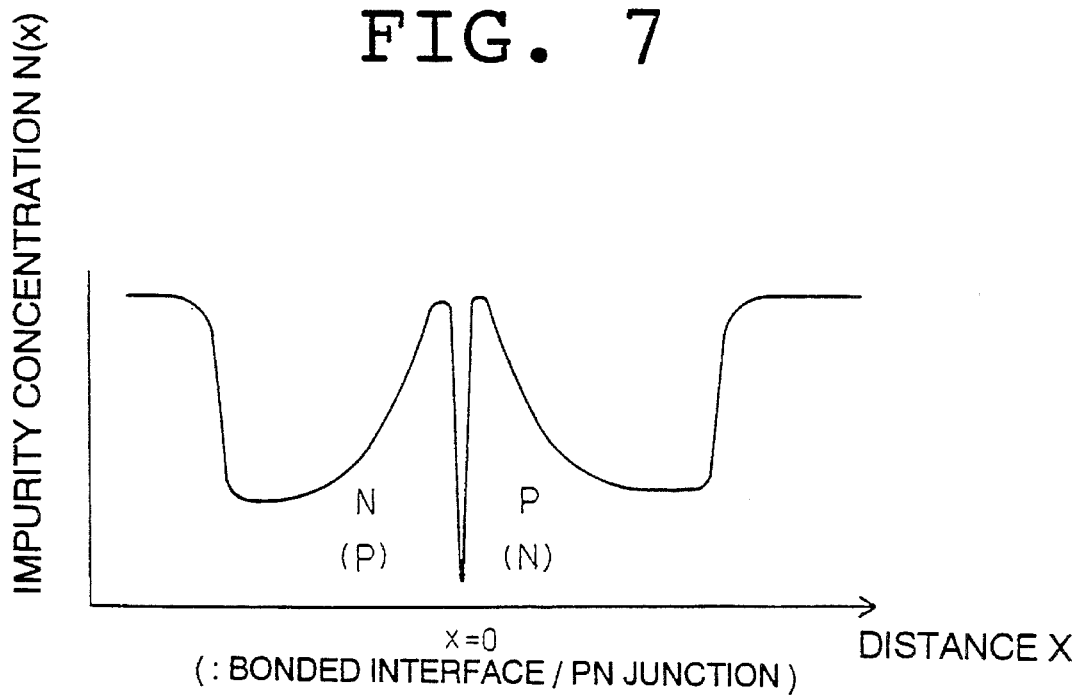
FIG. 7 is a graph showing an impurity concentration profile according to an embodiment of the present invention.
Figure 8:
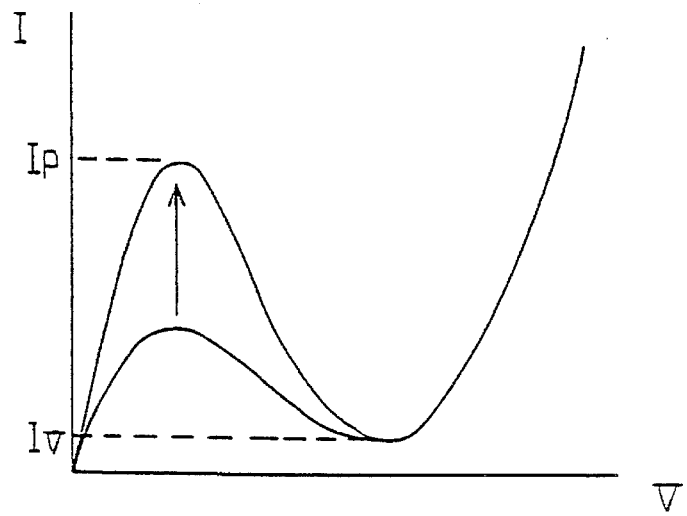
FIG. 8 is a graph showing the voltage-current characteristics when the semiconductor device of the present invention is applied to an Esaki diode.
Figure 9:
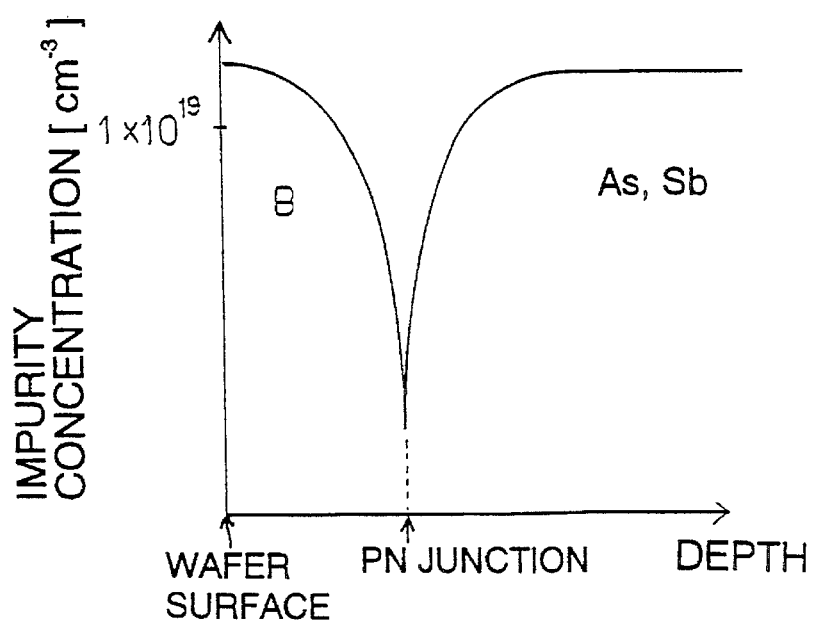
FIG. 9 is a graph showing an impurity concentration profile of the step type PN junction.

FIG. 8 illustrates the relation between the applied voltage and tunnel current of the Esaki diode formed in the impurity concentration profile shown in FIGS. 5 and 6. By arranging a hyper abrupt junction as shown in FIG. 6, the transition region width can greatly be reduced and the tunnel probability (number of tunnels) can be increased. As a result, the peak current of the tunnel current can be increased, whereby the ON-OFF current ratio and switching speed in switching can be improved.

Incidentally, when the impurity distribution is formed in such a way that either one layer is hyper abrupt type, the conductivity type of the semiconductor substrate may either be the P type or the N type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a first semiconductor substrate of a first conductivity type;

an impurity layer of the first conductivity type formed on a main surface of the first semiconductor substrate and having impurity distribution in which impurity concentration abruptly lowers in a depth direction from the main surface side of the first semiconductor substrate; and a second semiconductor substrate of a second conductivity type forming a bonded interface between the main surface of the first semiconductor substrate on the impurity layer side and a main surface of the second semiconductor substrate, having hyper abrupt type PN junction between the impurity layer and the second semiconductor substrate.

2. The semiconductor device according to claim 1, wherein the impurity layer has impurity distribution in which the impurity concentration lowers exponential functionally or linearly in the depth direction from the main surface side of the first semiconductor substrate.

3. The semiconductor device according to claim 1, wherein the impurity layer has impurity distribution in which the concentration distribution of the impurity is in proportion to a ($-\frac{3}{2}$) power of a depth from the main surface side of the first semiconductor substrate in the depth direction from the main surface side of the first semiconductor substrate.

4. The semiconductor device according to claim 1, wherein the second semiconductor substrate further comprises a second impurity layer of the second conductivity type formed within the second semiconductor substrate and having impurity distribution in which the impurity concentration lowers exponential functionally or linearly in a depth direction from the main surface side of the second semiconductor substrate.

5. The semiconductor device according to claim 4, wherein the second impurity layer has impurity distribution in which the concentration distribution of the impurity is in proportion to a ($-\frac{3}{2}$) power of a depth from the main surface side of the second semiconductor substrate in the depth direction from the main surface side of the second semiconductor substrate.

6. The semiconductor device according to claim 1, further comprising a third impurity layer within the second semiconductor substrate formed within a depth of 0 to 0.1 μm from the main surface side of the second semiconductor substrate and having the first conductivity type.

7. The semiconductor device according to claim 1, wherein the impurity layer of the first conductivity type has a peak impurity concentration of approximately $10^{19}$ cm$^{-3}$ and a decreasing impurity concentration at 1 order per approximately 50 nm in the depth direction.

8. The semiconductor device according to claim 1, wherein the impurity concentration of a highest part of the impurity distribution in the impurity layer of the first semiconductor substrate is approximately $10^{19}$ cm$^{-3}$ or more, the impurity concentration of a highest part of the impurity distribution in the second semiconductor substrate is approximately $10^{19}$ cm$^{-1}$ or more, and a distance between the highest part of the impurity distribution in the impurity layer of the first semiconductor substrate and the highest part of the impurity distribution in the second semiconductor substrate is approximately 50 nm or less.

9. A manufacturing method for a semiconductor device comprising the steps of:

forming an insulating film on a first semiconductor substrate of a first conductivity type;

implanting impurities of the first conductivity type through the insulating film into the first semiconductor substrate so that impurity distribution can abruptly lowers in a depth direction from a main surface side;

removing the insulating film;

bonding the main surface of the first semiconductor substrate and a main surface of a second semiconductor substrate of a second conductivity type to each other; and forming a PN junction between the first semiconductor substrate and the second semiconductor substrate by heat treating the bonded first semiconductor substrate and second semiconductor substrate.

10. The manufacturing method for a semiconductor device according to claim 9, wherein the implanting step includes a step of implanting the impurities of the first conductivity type into the first semiconductor substrate so that the impurity distribution is in proportion to a (−3/2) power of a depth from the main surface side of the first semiconductor substrate in the depth direction from the main surface side of the first semiconductor substrate.

11. The manufacturing method for a semiconductor device according to claim 9, further comprising a step of implanting impurities of the second conductivity type into the second semiconductor substrate of the second conductivity type between the first conductivity type impurities implanting step and the bonding step so that impurity distribution of the second semiconductor substrate abruptly decreases in a depth direction from the main surface side of the second semiconductor substrate.

12. The manufacturing method for a semiconductor device according to claim 11, wherein the implanting step of implanting the second conductivity type impurities includes a step of implanting the impurities of the second conductivity type into the second semiconductor substrate so that the concentration distribution of the impurity is in proportion to a (−3/2) power of a depth from the main surface side of the second semiconductor substrate in the depth direction from the main surface side of the second semiconductor substrate.

13. The manufacturing method for a semiconductor device according to claim 9, further comprising a step of forming a third impurity layer which moves a position of the PN junction from the bonded interface in the depth direction of the second semiconductor substrate for 0 to 0.1 μm by implanting impurities of the first conductivity type into a region of 0 to 0.1 μm in depth from the main surface side of the second semiconductor substrate, the third impurity layer forming step being provided between the implanting step and the bonding step.

\* \* \* \* \*